(12) United States Patent
Bukofsky et al.

(10) Patent No.: US 6,327,023 B1
(45) Date of Patent: Dec. 4, 2001

(54) OPTIMIZATION OF RETICLE ROTATION FOR CRITICAL DIMENSION AND OVERLAY IMPROVEMENT

(75) Inventors: Scott J. Bukofsky; Christopher J. Progler, both of Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/471,427

(22) Filed: Dec. 23, 1999

(51) Int. Cl.[7] ............................ G03B 27/42; G03B 27/52; G03B 27/32
(52) U.S. Cl. ............................ 355/53; 355/55; 355/77
(58) Field of Search ........................... 355/53, 55, 67–71, 355/77; 356/399–401; 430/5, 20, 22, 32

(56) References Cited

U.S. PATENT DOCUMENTS

| | | | |
|---|---|---|---|
| 4,544,311 | 10/1985 | Husain | 409/224 |
| 4,758,863 * | 7/1988 | Nikkle | 355/40 |
| 5,602,620 | 2/1997 | Miyazaki et al. | 355/53 |
| 5,767,948 | 6/1998 | Loopstra et al. | 355/53 |
| 5,945,239 | 8/1999 | Taniguchi | 430/30 |
| 6,011,611 * | 1/2000 | Nomura et al. | 355/67 |
| 6,067,375 * | 5/2000 | Tsudaka | 382/144 |
| 6,077,631 * | 1/2000 | Unno | 430/5 |

* cited by examiner

Primary Examiner—Russell Adams
Assistant Examiner—Henry Hung Nguyen
(74) Attorney, Agent, or Firm—Margaret A. Pepper

(57) ABSTRACT

A scanning method capable of reducing across chip linewidth variation and image placement error is disclosed, the method including a step whereby a reticle having a plurality of lines is scanned in a direction perpendicular to the lines. The scanning method includes a radiation source provided with an aperture with a slot. In this case, it is preferable that the radiation source keeps the rectangular slot in the direction that minimizes pattern distortions.

11 Claims, 3 Drawing Sheets

OPTIMIZATION OF RETICLE ROTATION FOR CRITICAL DIMENSION AND OVERLAY IMPROVEMENT

FIELD OF THE INVENTION

The present invention relates to an optical lithographic technique used in the formation of integrated circuits(ICs) on a wafer; and, more particularly, to an improved method for scanning a reticle having a plurality of lines thereon by keeping the direction of scanning in the direction that minimizes pattern distortion.

DESCRIPTION OF THE PRIOR ART

As is well known, photo lithography methods have been used for patterning a resist layer on a semiconductor wafer to form integrated circuits(ICs) such as processors, ASICs and Dynamic Random Access Memory(DRAM). As the ICs on the semiconductor wafer becomes smaller in dimensions, the photo lithography method is gaining more importance.

Presently, one of the most conventional photo lithography methods used nowadays is a stepper, so called as a step-and-repeater, which moves and aligns a wafer based on alignment marks on a reticle containing an image such that desired patterns on the wafer are exposed based on the image. The stepper includes a radiation lamp for generating radiation, an imaging lens, a reticle stage for mounting and moving the reticle and a wafer stage for loading the wafer. In the stepper, after the wafer is loaded on the wafer stage, the reticle stage searches and moves to a predetermined position to form a chip, thereby implementing alignment process. Thereafter, amounts of misalignment errors such as a X and a Y misregistration, rotation and orthogonal errors are measured to accurately position the reticle stage at the predetermined position. In the next step, the radiation from the radiation lamp travels to the imaging lens after passing through the reticle. The wafer is exposed by the radiation from the imaging lens by moving the wafer stage until the entire of the wafer is scanned. A number of successive steps of photo lithography, film growth, deposition and implantation of impurities create a complete IC with many identical copies on the same wafer. Each copy is known as a chip.

There is shown in FIG. 1 a schematic diagram of a relationship between a radiation lamp 16 and a reticle 10 for use in a conventional scanning method. The radiation lamp 16 is imaged through a slot 18 in such a way that the slot 18 is arranged in the form of a straight stick. The reticle 10 has a number of lines 12 and spaces 14. In the method, the radiation lamp 16 scans the reticle 10 along the direction I which is parallel to the lines 12.

One of problems associated with the above-described conventional scanning method is the lens aberrations, causing across chip linewidth variation and image placement errors. These errors are becoming a larger fraction of the total device error budget as feature sizes shrink.

SUMMARY OF THE INVENTION

It is, therefore, a primary object of the present invention to provide an improved method for scanning a reticle pattern having a plurality of lines thereon capable of reducing across chip linewidth variation and image placement errors.

In accordance with the invention, a process of rotating a reticle pattern as part of device flow for critical dimension and overlay optimization is provided.

A further object of the invention is to provide a process to determine interaction between reticle pattern orientation, lens quality, illumination condition and device layout, and to provide a process to optimize reticle pattern orientations level by level.

Further, a method for exposure tool implementation, e.g., software and hardware to support wafer rotations within device flow, is provided.

In accordance with one aspect of the present invention, there is provided a method for patterning a reticle pattern on a wafer loaded on a wafer stage, wherein the reticle pattern has a plurality of lines, the method comprising the step of: loading the reticle pattern on a reticle stage; performing simulations with appropriate lens aberration set, taking into account multiple reticle orientations; determining an optimum reticle pattern orientation for the loaded reticle based on the simulation results; scanning the reticle pattern while keeping the optimum reticle pattern orientation as the reticle pattern is imaged by a radiation source.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

The present invention relates to an improved method for scanning a reticle pattern having a plurality of lines thereon capable of reducing across chip line width variation and image placement errors. In accordance with the invention, individual levels are optimized in their rotation on a level-by-level basis as part of a process flow. That is, a given level has an orientation which is optimized to minimize lens effects, and the wafer in the exposure tool is rotated appropriately.

Thus, there is preferential rotation of each individual level, depending on its optimum orientation. The orientation must be determined by a simulation engine which takes the appropriate aberration data into account.

Referring to FIGS. 2 to 5, there are provided schematic diagrams and a flow chart of inventive scanning methods for use in a stepper in accordance with preferred embodiments of the present invention.

Figure 1:
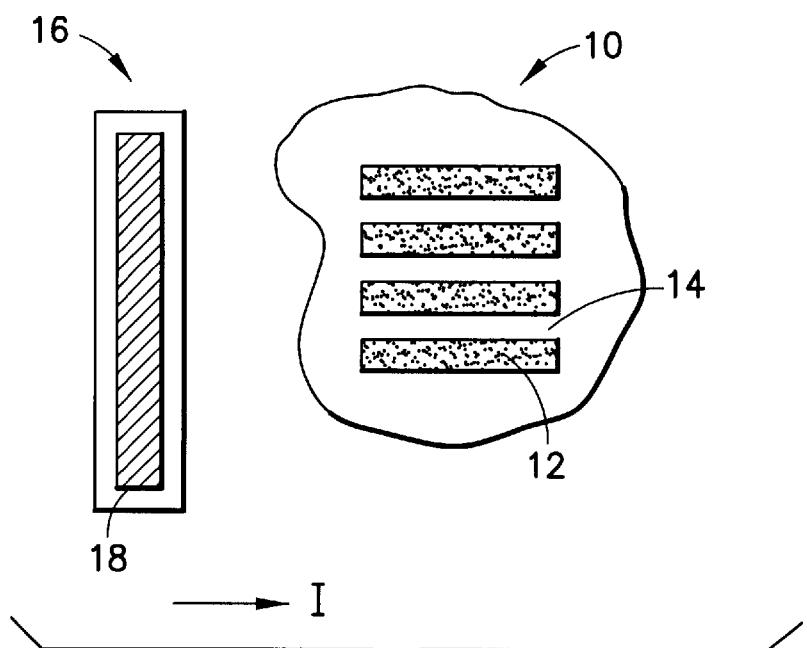
FIG. 1 is a schematic diagram showing a conventional method for scanning a reticle pattern having a plurality of lines by a radiation source in the direction parallel to the lines.
Figure 2:
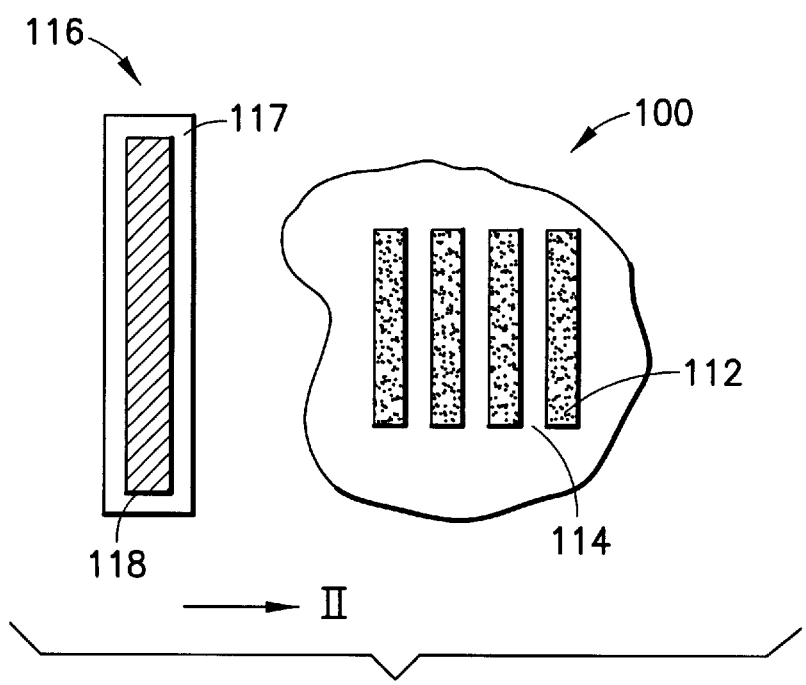
FIG. 2 presents a schematic diagram depicting a method for scanning a reticle pattern having a plurality of lines by a radiation source in the direction perpendicular to the lines in accordance with the present invention.

FIG. 2 is a schematic diagram showing a relationship between a radiation source 116 and a reticle 100 having a plurality of lines 112 and spaces 114 as the radiation source 116 scans the reticle 100 in the direction which is perpendicular to the lines 112. The radiation source 116 incorporates therein a radiation lamp(not shown) such as a mercury-vapor lamp for emitting an illuminating radiation and an aperture blade 117 provided with a rectangular slot 118. In the preferred embodiment, the aperture blade 117 is in the form of a straight stick. It should be noted that it is possible to use, as the illuminating radiation, a laser light such as an eximer laser, a metal vapor laser or the like. The reticle 100 comprises a transparent substrate and a pattern, e.g., a gate conductor level of a DRAM cell, formed thereon. The transparent substrate is generally planar and essentially free of defects on the surfaces, as well as internally, and should have high optical transmission or reflection at a desired resist exposure wavelength. It should be noted that several types of glasses such as a soda-lime glass, borosilicate glass and quartz have been used for making the reticle 100. The pattern of the reticle 100 comprises a plurality of opaque lines 112, preferably made of chrome, and spaces 114 formed between the lines 112. The reticles can comprise opaque materials other than chrome, e.g., phase shift materials.

In the preferred embodiment of the present invention, the pattern of the reticle 100 is scanned by the radiation source 116 in the direction II such that both chip linewidth variation and image placement(IP) errors, due to the asymmetric aberrations associated with an imaging lens, are minimized, wherein the scanning direction II is determined by simulation results. This is achieved simply by rotating the reticle pattern on reticle 100 in such a way that the lines 112 of the reticle pattern are aligned perpendicular to the scanning direction. This would also have to be paired with an appropriate rotation of the wafer on a wafer stage. In addition, it is preferable that the aperture blade 117 and the lines 112 are arranged parallel to each other.

Figure 3:
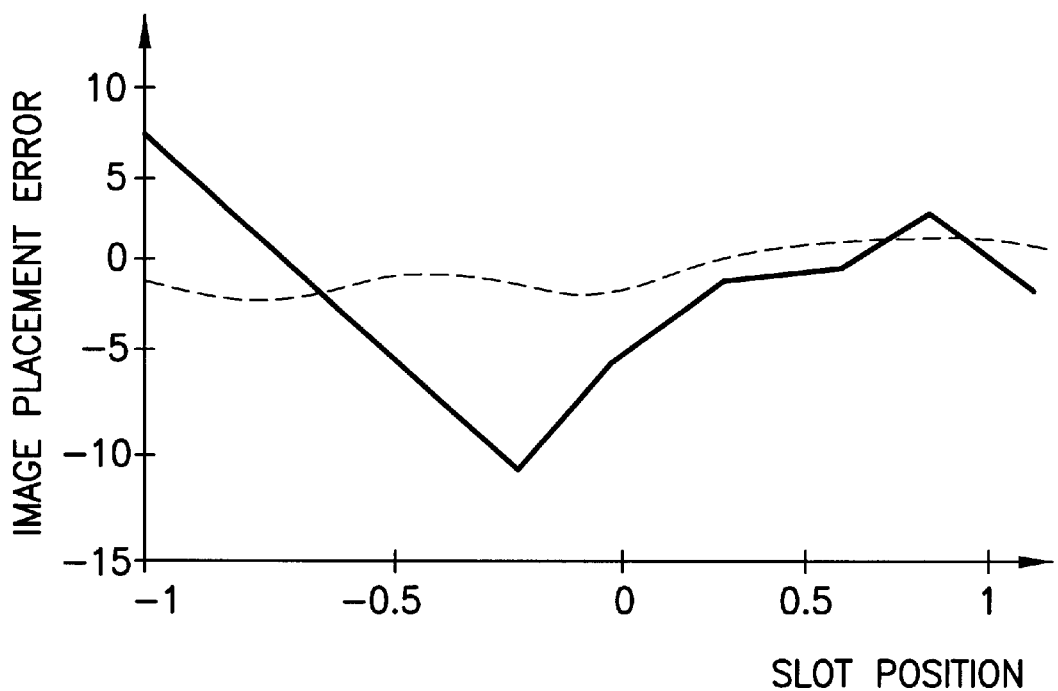
FIG. 3 shows image displacement errors of a line/space pattern imaged with a set of lens aberrations for a stepper as a function of the slot position between the reticle and the radiation source.
Figure 4:
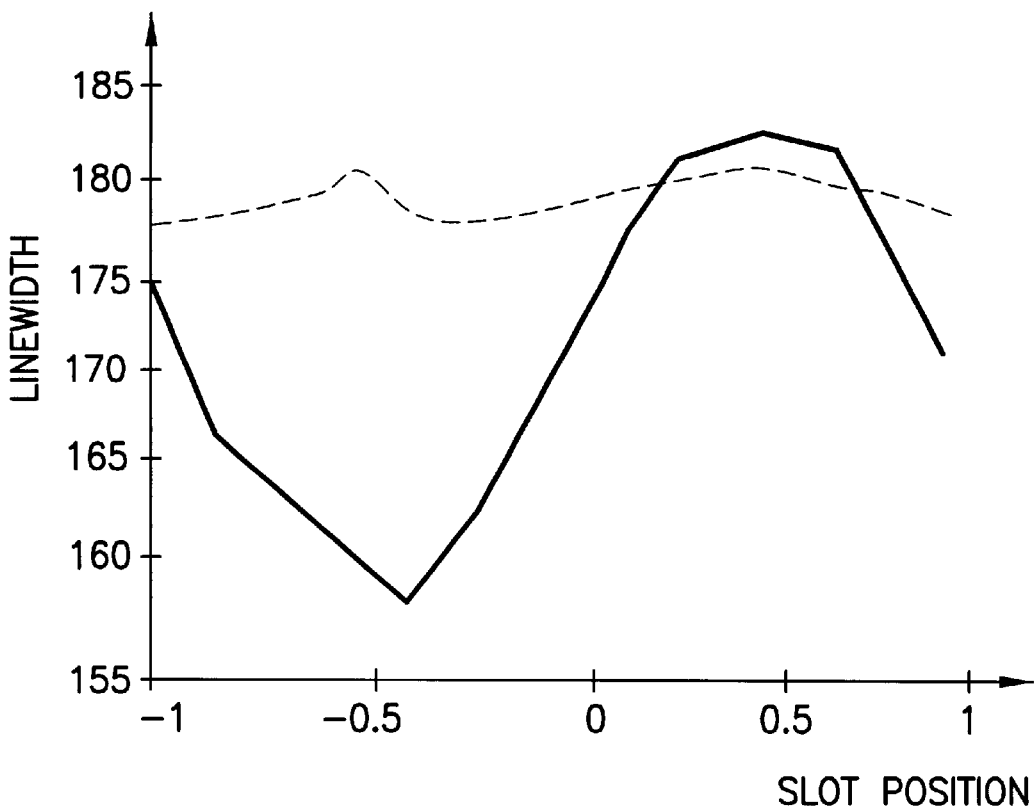
FIG. 4 depicts linewidths imaged with the set of lens aberrations for the stepper as a function of the slot position between the reticle and the radiation source.

There are illustrated in FIGS. 3 and 4 some simulation data. Specifically, FIG. 3 is a simulation of a line/space pattern imaged with a typical set of lens aberrations for a stepper as a function of the slot position which is the position describes various points along the length of the rectangular. In FIG. 3, a dotted line represents the image displacement error data in accordance with the present invention and a solid line represents the image displacement error data according to the conventional scanning method.

The results illustrated in FIG. 3 show that scanning along the long axis of the pattern results in worse placement errors. This would manifest itself as an overlay shift on a wafer. Large differences in placement error are possible in this scanning orientation since the asymmetric aberrations associated with the imaging lens tend to have larger magnitudes and very more strongly in the radial directions, while the opposite case (dotted line) shows little effect since all of the lines see approximately the same level of asymmetric aberrations yielding a fixed pattern offset that can be removed as a mean.

Also, FIG. 4. shows a similar simulation, this time showing a strong effect on across field linewidth variation as a function of the slot position. Once again, the solid and dotted lines represent scanning in two orthogonal directions, solid line representing the simulation data obtained when scanned along the long axis of the pattern. As above, large variations in linewidth may result when scanned along the long axis of the pattern.

This invention also encompasses the idea of reticle-specific variation. This takes into account the fact that each level in the device stack is positioned perpendicular to the other levels. That is, the best orientation for one level is not the best for another, since the lines are orthogonal. To account for this, each reticle pattern is rotated independently of the others, to achieve the optimal performance. This would have to be paired with an appropriate rotation of the wafer on a wafer stage. In this way, with no changes in design, large improvements both in image placement error and linewidth control can be realized.

Figure 5:
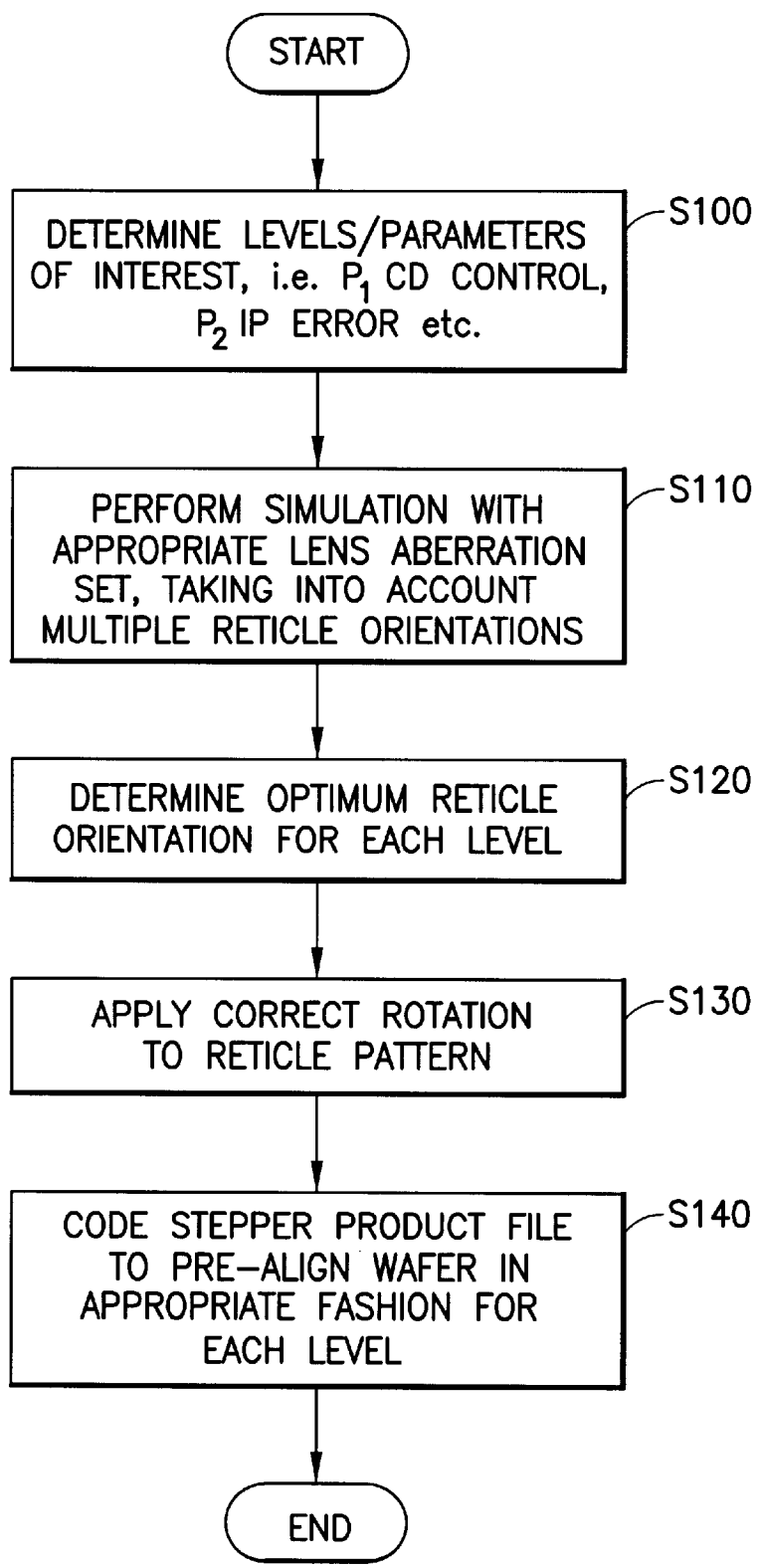
FIG. 5 represents a flow chart illustrating the sequence of scanning the reticle pattern according to present invention.

With reference to FIG. 5, the method for scanning the stack of reticles to be sequentially loaded on the reticle stage in accordance with the present invention will now be described in detail. The main feature of the invention is the use of simulation to determine the optimum orientation of each level. The inventive scanning method starts at step 100.

At step 100, a controller(not shown) determines levels/parameters of interest, i.e., critical dimension(CD) for one level and an image placement for the next level, for the reticle pattern. At step 110, simulations with appropriate lens aberration set are performed, taking into account multiple reticle pattern orientations. At step S120, an optimum reticle orientation for the reticle pattern is determined based on the simulation results. These effects are intimately linked to product feature, and cannot be measured by conventional test structure found in the kerf. Technically, the simulations may be done long before the wafer or reticle comes near the stepper tool. The appropriate rotations would be pre-determined and coded in the stepper files. The simulation engine is key to this process. At step 130, the correct rotation determined based on the simulation results is applied to the reticle pattern. At step 140, the stepper product file is coded to pre-align the wafer in an appropriate fashion for each level.

This invention would not replace other methods, but would be an additional tool for improvement. This invention has the advantage of simplicity, however, since no new designs are needed, simply rotation of existing designs.

While the present invention has been described with respect to the preferred embodiments, other modifications and variations may be made without departing from the spirit and scope of the present invention as set forth in the following claims.

What is claimed is:

1. A method for imaging a reticle pattern through a lens onto a wafer, wherein the reticle pattern has a plurality of lines, the method comprising the steps of:

simulating formation of an image of said reticle pattern on said wafer at a plurality of pattern orientations, taking into account known lens aberrations;

determining an optimum reticle pattern orientation with respect to a scanning direction, based on results of said simulation;

forming a reticle having said reticle pattern in said optimum orientation;

loading said reticle on a reticle stage;

loading said wafer on a wafer stage, wherein said wafer is oriented with respect to said scanning direction to match said optimum orientation of said reticle pattern; and projecting radiation through said reticle and said lens onto said wafer, thereby imaging said reticle pattern onto said wafer.

2. The method of claim 1, wherein said radiation is projected from a radiation source which includes an aperture means provided with a rectangular slot.

3. The method of claim 2, wherein said slot remains parallel to said lines of said reticle pattern.

4. The method of claim 1, wherein said reticle pattern is applicable to memory technologies.

5. The method of claim 1, wherein said optimum reticle pattern orientation is an orientation such that said lines of said reticle pattern are perpendicular to said scanning direction.

6. The method of claim 1, wherein said wafer is oriented by rotating said wafer stage to match said optimum reticle pattern orientation.

7. A method for sequentially imaging a plurality of reticle patterns through a lens onto a wafer, wherein each of said reticle patterns has a plurality of lines, the method comprising the steps of:

(a) simulating formation of an image of a first reticle pattern on said wafer at a plurality of pattern orientations, taking into account known lens aberrations;

(b) determining an optimum reticle pattern orientation with respect to a scanning direction for said first reticle pattern based on results of said simulation;

(c) forming a first reticle having said first reticle pattern in said optimum orientation;

(d) repeating steps (a) to (c) for each reticle pattern, thereby forming a plurality of reticles, each having one of said reticle patterns in said optimum orientation;

(e) loading said first reticle on a reticle stage;

(f) loading said wafer on a wafer stage, wherein said wafer is oriented with respect to said scanning direction to match said optimum orientation of said first reticle pattern;

(g) projecting radiation through said first reticle and said lens onto said wafer, thereby imaging said first reticle pattern onto said wafer; and (h) repeating steps (e) to (g) for each reticle, thereby imaging each of said reticle patterns onto said wafer.

8. The method of claim 7, wherein said radiation is projected from a radiation source which includes an aperture means provided with a rectangular slot.

9. The method of claim 8, wherein said slot remains parallel to said lines of said reticle patterns.

10. The method of claim 9, wherein each of said reticle patterns is applicable to memory technologies.

11. The method of claim 7, wherein said wafer is oriented by rotating said wafer stage to match said optimum reticle pattern orientation.

* * * * *